US009627295B2

(12) United States Patent
Jindal et al.

(10) Patent No.: US 9,627,295 B2
(45) Date of Patent: Apr. 18, 2017

(54) DEVICES, SYSTEMS AND METHODS FOR MANUFACTURING THROUGH-SUBSTRATE VIAS AND FRONT-SIDE STRUCTURES

(71) Applicant: Micron Technology, Inc., Boise, ID (US)

(72) Inventors: Anurag Jindal, Boise, ID (US); Jian He, Singapore (SG); Lalapet Rangan Vasudevan, Singapore (SG); Kyle K. Kirby, Eagle, ID (US); Hongqi Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/059,020

(22) Filed: Mar. 2, 2016

(65) Prior Publication Data
US 2016/0190042 A1 Jun. 30, 2016

Related U.S. Application Data

(62) Division of application No. 14/068,837, filed on Oct. 31, 2013, now Pat. No. 9,305,865.

(51) Int. Cl.
*H01L 23/48* (2006.01)
*H01L 21/76* (2006.01)
(Continued)

(52) U.S. Cl.
CPC ...... *H01L 23/481* (2013.01); *H01L 21/76801* (2013.01); *H01L 21/76838* (2013.01);
(Continued)

(58) Field of Classification Search
CPC ....... H01L 21/60; H01L 21/768; H01L 21/71; H01L 23/48; H01L 23/522; H01L 23/538; G06F 17/50
(Continued)

(56) References Cited

U.S. PATENT DOCUMENTS 6,137,180 A 10/2000 Sandhu et al.
2006/0024917 A1* 2/2006 Henley ............... H01L 21/2007
438/455
(Continued)

FOREIGN PATENT DOCUMENTS

TW 201230281 A 7/2012

OTHER PUBLICATIONS

International Search Report and Written Opinion mailed Jan. 29, 2015 in International Application No. PCT/US2014/063039, 10 pages.
(Continued)

*Primary Examiner* — Jessica Manno
*Assistant Examiner* — Sheikh Maruf
(74) *Attorney, Agent, or Firm* — Perkins Coie LLP (57) ABSTRACT

Methods of manufacturing semiconductor devices and semiconductor devices with through-substrate vias (TSVs). One embodiment of a method of manufacturing a semiconductor device includes forming an opening through a dielectric structure and at least a portion of a semiconductor substrate, and forming a dielectric liner material having a first portion lining the opening and a second portion on an outer surface of the dielectric structure laterally outside of the opening. The method further includes removing the conductive material such that the second portion of the dielectric liner material is exposed, and forming a damascene conductive line in the second portion of the dielectric liner material that is electrically coupled to the TSV.

10 Claims, 12 Drawing Sheets

(51) Int. Cl.
*H01L 23/52* (2006.01)
*H01L 21/768* (2006.01)
*H01L 23/528* (2006.01)
*H01L 23/532* (2006.01)
*H01L 23/522* (2006.01)

(52) U.S. Cl.
CPC ...... *H01L 21/76898* (2013.01); *H01L 23/528* (2013.01); *H01L 23/5329* (2013.01); *H01L 23/53228* (2013.01); *H01L 23/522* (2013.01); *H01L 2924/0002* (2013.01)

(58) Field of Classification Search
USPC .............. 438/667, 637; 257/741, 770–774, 257/E21.507, E23.011
See application file for complete search history.

(56) References Cited

U.S. PATENT DOCUMENTS

| | | | |
|---|---|---|---|
| 2006/0270187 A1* | 11/2006 | Kerdiles | H01L 21/76254 438/455 |
| 2007/0158853 A1 | 7/2007 | Sinha | |
| 2009/0315154 A1 | 12/2009 | Kirby et al. | |
| 2010/0178761 A1 | 7/2010 | Chen et al. | |
| 2010/0317140 A1* | 12/2010 | Brailove | H01L 21/67213 438/57 |
| 2011/0014775 A1* | 1/2011 | Akiyama | H01L 21/76256 438/458 |
| 2011/0221044 A1 | 9/2011 | Danek et al. | |
| 2011/0241185 A1* | 10/2011 | Koester | H01L 21/568 257/659 |
| 2012/0018851 A1* | 1/2012 | Farooq | H01L 21/6835 257/621 |
| 2012/0083116 A1 | 4/2012 | Yang et al. | |
| 2012/0258590 A1 | 10/2012 | Chen et al. | |
| 2012/0267786 A1* | 10/2012 | Kirby | H01L 21/76898 257/770 |
| 2012/0289062 A1 | 11/2012 | Lo et al. | |
| 2013/0075268 A1 | 3/2013 | England et al. | |
| 2013/0119547 A1 | 5/2013 | Kim et al. | |
| 2013/0161796 A1* | 6/2013 | Huang | H01L 23/481 257/621 |
| 2013/0200519 A1* | 8/2013 | Feng | H01L 21/76898 257/751 |
| 2013/0244424 A1* | 9/2013 | Edelstein | H01L 21/76841 438/653 |
| 2013/0270711 A1* | 10/2013 | Hebding | H01L 21/768 257/774 |
| 2013/0270712 A1 | 10/2013 | Chen et al. | |
| 2013/0285257 A1* | 10/2013 | Lee | H01L 24/03 257/774 |
| 2013/0320538 A1 | 12/2013 | Jindal et al. | |
| 2014/0117545 A1 | 5/2014 | Liu et al. | |
| 2015/0262870 A1* | 9/2015 | Lin | H01L 23/5226 257/751 |

OTHER PUBLICATIONS

Office Action mailed Feb. 22, 2016 in Taiwan Application No. 103137929, 11 pages.

* cited by examiner

DEVICES, SYSTEMS AND METHODS FOR MANUFACTURING THROUGH-SUBSTRATE VIAS AND FRONT-SIDE STRUCTURES

CROSS-REFERENCE TO RELATED APPLICATION

This application is a divisional of U.S. application Ser. No. 14/068,837, filed Oct. 31, 2013, which is incorporated herein by reference in its entirety.

TECHNICAL FIELD

The present technology is related to manufacturing semiconductor devices, and more specifically several embodiments are related to through-substrate vias (TSVs) and associated metallization structures.

BACKGROUND

Forming semiconductor devices typically includes performing a series of processes that add, remove, and/or alter materials in and/or on a substrate or other assembly. Cumulatively, these processes can precisely form very high densities of transistors, capacitors, diodes, conductive lines, dielectric structures, and other components of an integrated circuit. The electrical connections between the electrical components can be complex and typically extend over and through multiple layers of dielectric, conductive and semiconductive materials. Electrical connections from one layer to another layer can be formed in openings or holes, which can be selectively etched in desired patterns. For example, through-substrate vias (TSVs) are formed in TSV holes that extend through the substrate or packaging material such that the TSVs can electrically couple bond pads or other contacts on opposite sides of a wafer or package. Such openings and TSV holes are typically lined with a dielectric material, e.g., silicon dioxide, to electrically isolate the metal or other conductive material within the openings from the semiconductor substrate or other nearby structures. Depositing dielectric liners exclusively in the openings can be technically challenging, so dielectric liners are generally formed by depositing a continuous layer (i.e., conformal blanket layer) of dielectric liner material over the front-side of the wafer and into the openings, and performing an etch-back process to completely remove the portion of the dielectric liner material from the backside or front-side outer surface of the wafer.

Conventionally, the dielectric liner material on the outer surface of the wafer is removed using a chemical-mechanical planarization process with a suitable slurry ("spacer CMP") before filling the TSV holes with a conductive material. Spacer CMP processes seek to remove the top portion of the continuous dielectric liner material without damaging underlying structures by removing the dielectric materials and metals at significantly different rates and having a relatively thick low-k dielectric material underneath the dielectric liner material. Moreover, after forming the TSVs, a permanent dielectric material separate from the dielectric liner material is deposited and patterned to form trenches over the TSVs and other contacts that are spaced laterally apart from the TSVs. The trenches are then filled with a conductive material to form conductive lines that are electrically coupled to corresponding contacts and TSVs. Conventional TSV manufacturing requires several process steps and materials that increase the complexity of the manufacturing process. Accordingly, there is a need for innovation in this area and in related areas of semiconductor device manufacturing.

BRIEF DESCRIPTION OF THE DRAWINGS

Many aspects of the present technology can be better understood with reference to the following drawings. The components in the drawings are not necessarily to scale, but rather, emphasis is placed on clearly illustrating the principles of the present technology.

DETAILED DESCRIPTION

Specific details of several embodiments of methods for making semiconductor devices are described herein along with related devices and systems. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of TSVs (e.g., through-silicon vias), such as electrically conductive plugs or connectors that extend completely through the substrate and/or packaging material when completed. A person having ordinary skill in the relevant art will also understand that the present technology may have additional embodiments, such as embodiments including other electrical connectors in a wafer, and that the present technology may be practiced without several of the details of the embodiments described herein with reference to FIGS. 1-17. For ease of reference, identical reference numbers are used to identify similar or analogous components or features throughout this disclosure, but the use of the same reference number does not imply that the features should be construed to be identical. Indeed, in many examples described herein, identically numbered features or processes have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

Planarizing semiconductor devices to remove excess portions of a blanket or continuous dielectric material around unfilled openings can be disadvantageous. For example, in conventional processes the spacer CMP step must remove the dielectric liner material from the front-side of the wafer without dishing the blanket dielectric material from the TSV openings or removing too much of the underlying dielectric material and damaging conductive features (e.g., tungsten contacts). As such, the spacer CMP step may require a relatively thick underlying dielectric material (e.g., 350 Å) to protect the underlying features. Moreover, after removing the top portion of the dielectric liner material and filling the TSV openings with a conductive material, an additional dielectric damascene material suitable as a permanent dielectric for damascene conductive lines must be deposited and patterned to form the desired metallization. As a result, the dielectric liner requires a separate removal step (e.g., spacer CMP), and both the dielectric liner and the additional dielectric damascene material overlaying the TSVs must be deposited on the wafer.

Methods in accordance with embodiments of the present technology eliminate the spacer CMP step such that the outer portion of the dielectric liner material on the backside or front-side surface of the wafer laterally outside of the TSV openings is incorporated into the final device either in lieu or in addition to a damascene dielectric material The outer portion of the dielectric line material can accordingly provide dielectric material in which conductive lines of a metallization structure are formed on the wafer. By leaving the outer portion of the dielectric liner material on the wafer, any underlying dielectric material can be relatively thin (e.g., 150 Å) because the dielectric liner material itself protects underlying structures during subsequent CMP processes. Also, leaving the outer portion of the dielectric liner material on the wafer can eliminate the need to deposit an additional damascene dielectric material for front-side metallization. Moreover, the top-side dielectric liner material may reduce dishing compared to processes that remove the top-side dielectric liner material before depositing a barrier/seed material and filling the TSV opening with the conductive plug material. Several embodiments of the present technology accordingly simplify manufacturing TSVs by eliminating several process steps (e.g., the spacer CMP and subsequent deposition of a front-side damascene dielectric material) and reducing the volume and number of materials to form the TSV (e.g., the thickness of the underlying dielectric material under the dielectric liner material and the additional front-side damascene dielectric material). These features will become more apparent with reference to FIGS. 1-14.

Figure 1:
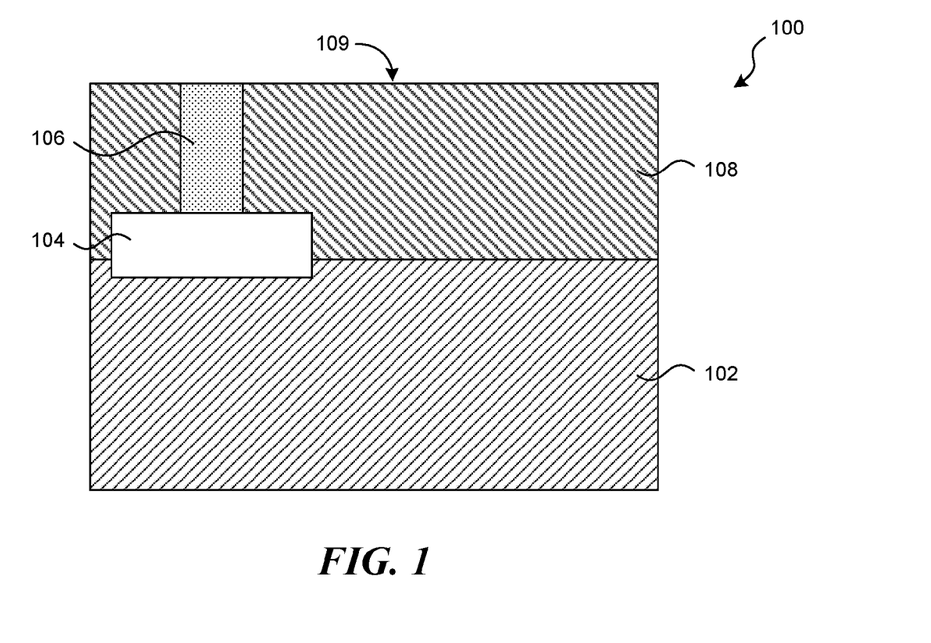
FIGS. 1-13 are partially schematic cross-sectional views illustrating a semiconductor device at selected steps in a method for making conductive structures in accordance with an embodiment of the present technology.

FIGS. 1-13 are partially schematic cross-sectional views illustrating a portion of a semiconductor device 100 at a series of stages of a method for making through-substrate vias or other connectors in accordance with an embodiment of the present technology. As shown in FIG. 1, the semiconductor device 100 can include a substrate 102, an electrical component 104 (shown schematically), and a contact 106 extending from the electrical component 104 through a first dielectric material 108. The electrical component 104 can be a transistor (e.g., a bipolar or field-effect transistor), a diode, a capacitor, or another suitable solid-state component formed in and/or on the substrate 102. In some embodiments, the contact 106 can be a gate electrode and the semiconductor device 100 can further include a source electrode (not shown) and a drain electrode (not shown). Suitable materials for the contact 106 include tungsten, among others. As shown in FIG. 1, the first dielectric material 108 can have a generally planar surface 109.

Figure 2:
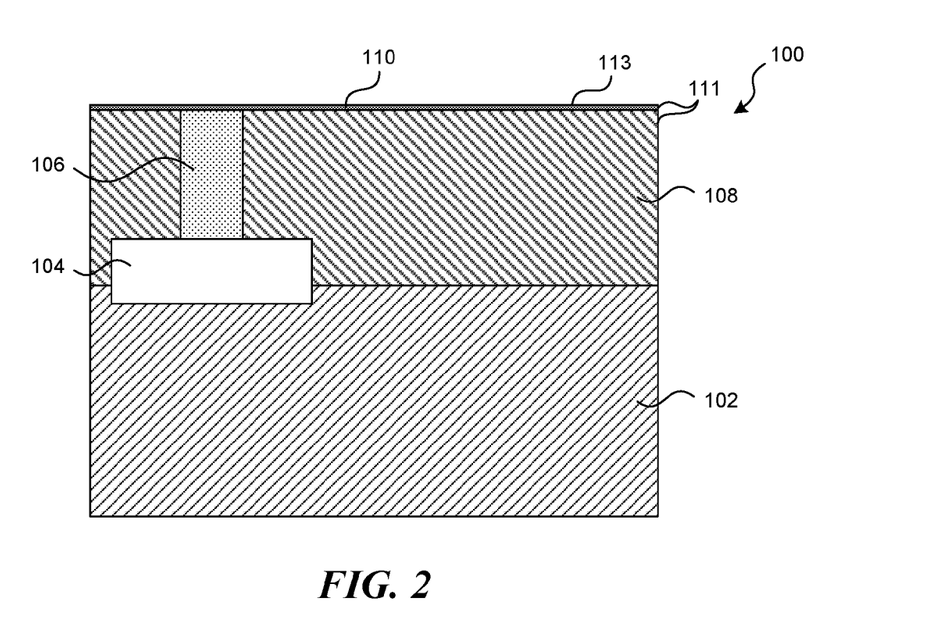

FIG. 2 shows the semiconductor device 100 after a stop material 110 has been formed on the planar surface 109. The stop layer 110 can be a second dielectric material different than first dielectric material 108. In several embodiments, the stop material 110 can include a low-k dielectric material, e.g., a dielectric material having a lower dielectric constant than silicon dioxide. Furthermore, the stop material 110 can be selected to have a low removal rate to enhance control over planarization. In some embodiments, the stop material 110 can include silicon nitride, e.g., carbon-doped silicon nitride, or another suitable material. The first dielectric material 108 and the stop material 110 can together define a dielectric structure 111 having an outer surface 113.

Figure 3:
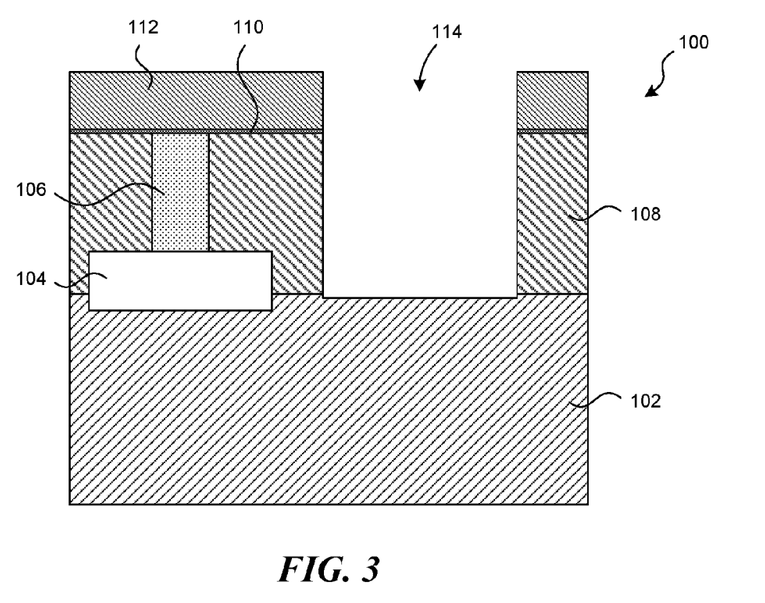

FIG. 3 shows the semiconductor device 100 after a first portion of an opening 114 has been formed through the first dielectric material 108. The opening 114 can be formed by methods known in the art, e.g., depositing a photoresist 112 on the stop material 110, and patterning the photoresist 112 using photolithography or other suitable techniques. The stop material 110 and the first dielectric material 108 can then be etched using a first etch to form the first portion of the opening 114 to the depth of the substrate 102. Although, only one opening 114 is shown in FIG. 3 for simplicity of illustration, the semiconductor device 100 can include a plurality of openings 114.

Figure 4:
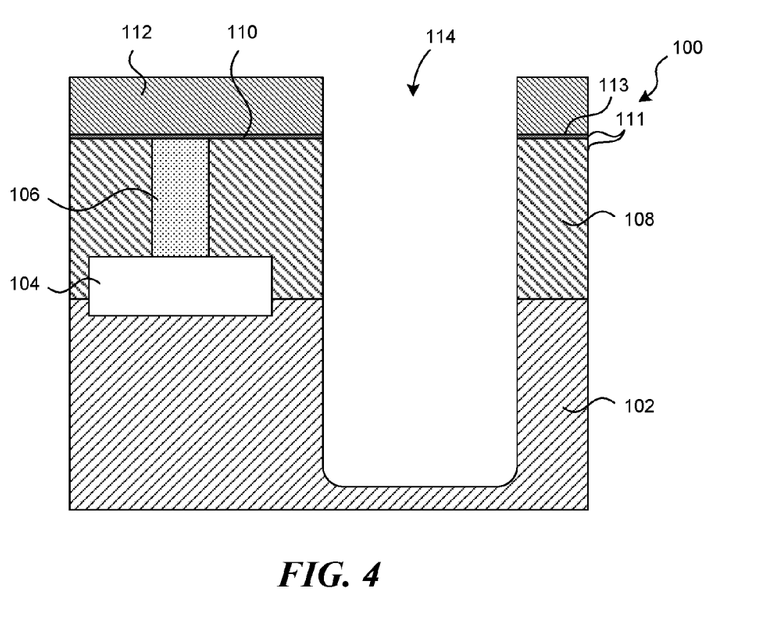

FIG. 4 shows the semiconductor device 100 after a second etch extends the depth of the opening 114 through at least a portion of the substrate 102. The first and second etches shown in FIGS. 3 and 4, respectively, can be performed using plasma etching or other suitable techniques, and the first and second etches can involve different processing parameters selected for removing the different materials of the first dielectric material 108 and at least a portion of the substrate 102, respectively. In other embodiments, the opening 114 can be formed through the first dielectric material 108 and the substrate 102 using a single etch.

Figure 5:
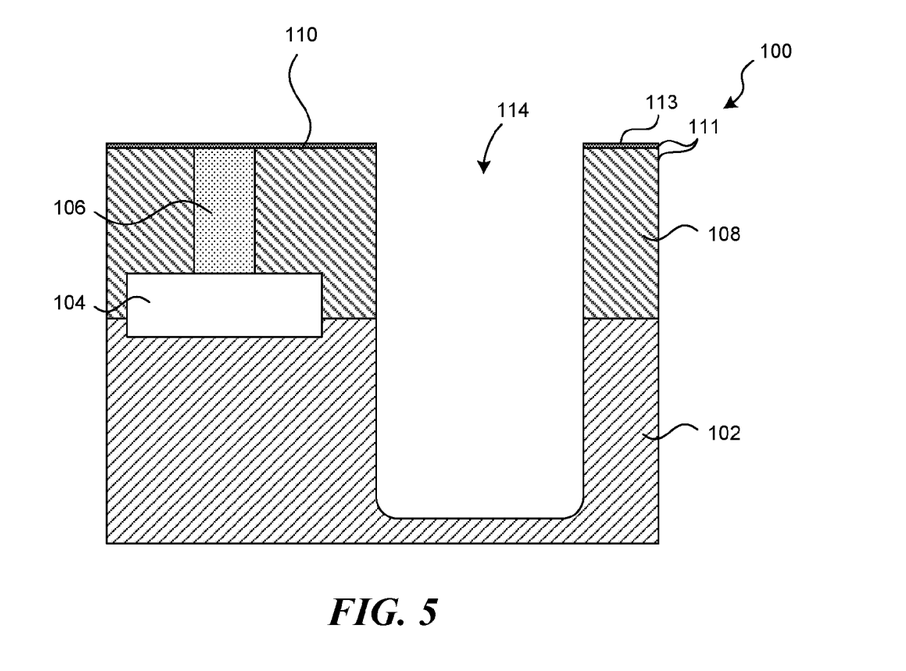

FIG. 5 shows the semiconductor device 100 after the opening 114 has been etched to its full depth in the substrate 102 and after the remaining photoresist 112 has been removed, e.g., using plasma ashing, wet cleans, or other suitable removal techniques. The opening 114 can have a sidewall extending to a depth within, but not completely through, the substrate 102 as shown in FIG. 5 (e.g., a blind hole with a closed bottom). Alternatively, the opening 114 can have a sidewall extending completely through the substrate 102 at this stage of the process.

Figure 6:
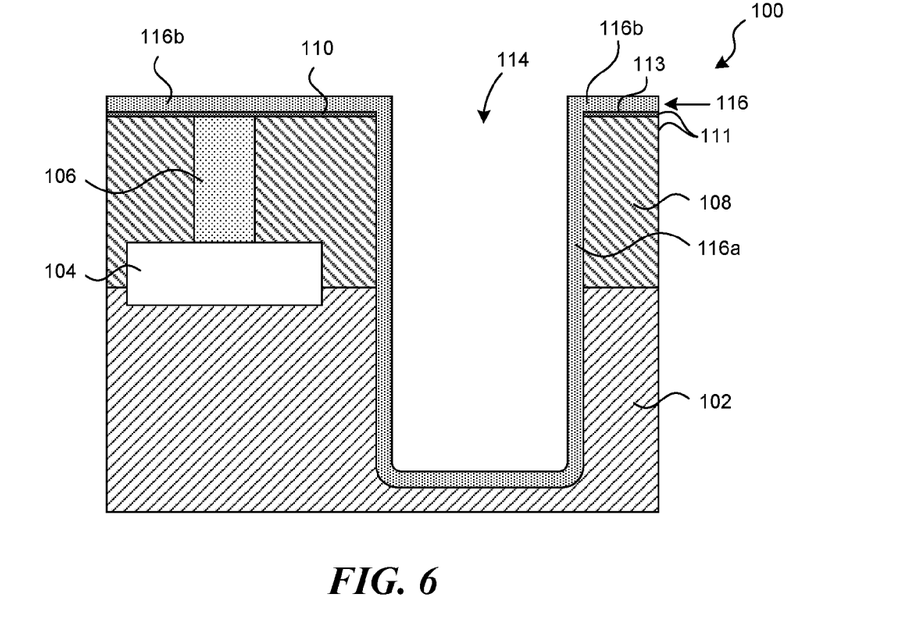

FIG. 6 shows the semiconductor device 100 after a continuous, conformal dielectric liner material 116 has been formed on the outer surface 113 and in the opening 114. The dielectric liner material 116 has a first portion 116a lining the sidewall and bottom surface within the opening 114 and a second portion 116b on the outer surface 113 of the dielectric structure 111 laterally outside the opening 114. The first and second portions 116a and 116b of the dielectric liner material 116 are continuous with each other. For example, the first and second portions 116a and 116b are formed from the same material in a single process. The composition and/or thickness of the dielectric liner material 116 can be selected to enhance the properties of the first portion 116a. For example, the dielectric liner material 116 can be sufficiently thick (e.g., from about 0.05 micron to about 1.5 micron or from about 0.1 micron to about 0.4 micron) to electrically isolate the substrate 102 from a conductive structure (not shown in FIG. 6) that is formed in the opening 114 in subsequent processes as described below. The composition and thickness of the dielectric liner material 116 can also be selected to enhance the properties of the second portion 116b. For example, the dielectric liner material 116 can be made from, among other materials, an undoped oxide film, and have an initial thickness of 3000-8000 Å.

Figure 7:
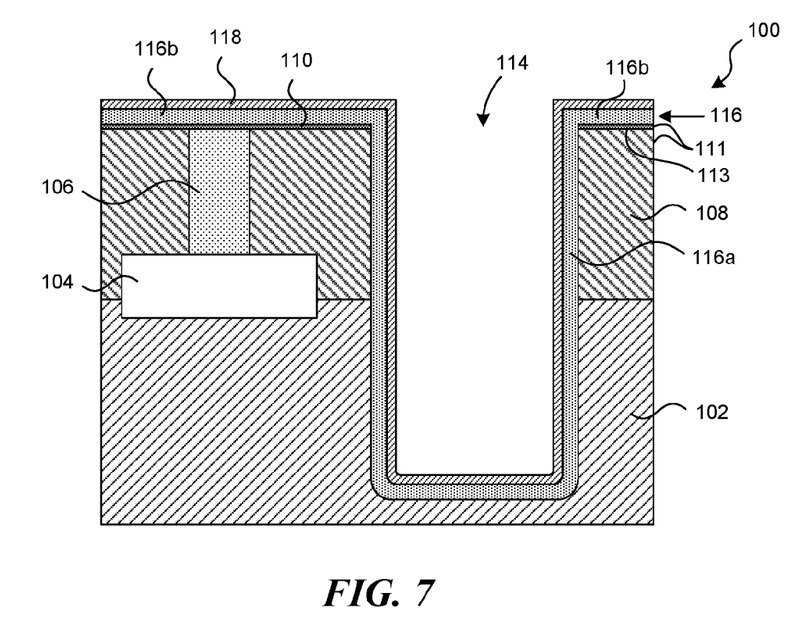

FIG. 7 shows the semiconductor device 100 after a barrier/seed structure 118 has been formed on the dielectric liner material 116. The barrier/seed structure 118 can be configured to reduce diffusion of conductive material used to form the conductive structure (not shown in FIG. 7) in the opening 114 in subsequent processes, as well as to seed formation of the conductive structure by plating, e.g., electro-plating or electroless-plating processes. In several embodiments, the barrier/seed structure 118 can have a barrier material that does not seed formation of the conductive structure and a seed material on the barrier material. The barrier material, for example, can include tantalum, tantalum nitride, or another suitable material, and the seed material can be copper, copper alloy, or other conductive materials. In other embodiments, the barrier/seed structure 118 can have only a single material that limits diffusion and seeds formation of a bulk conductive material. In some embodiments, the barrier/seed structure 118 may be eliminated.

Figure 8:
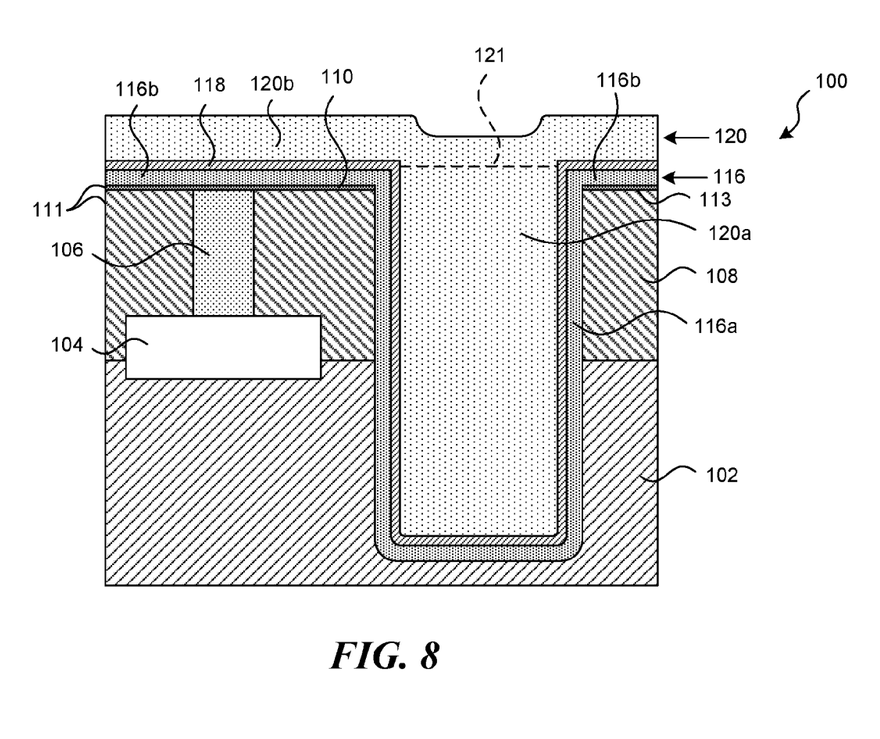

FIG. 8 shows the semiconductor device 100 after a bulk conductive material 120 has been formed over the barrier/seed structure 118. The bulk conductive material 120 can include a plug portion 120a within the opening 114 and an excess portion 120b over the plug portion 120a and over the outer surface 113 of the dielectric structure 111 laterally outside of the opening 114 (e.g., over the second portion 116b of the dielectric liner material 116). For example, the excess portion 120b can be the portion of the bulk conductive material 120 above a conceptual elevation 121 (shown as a dashed line). In several embodiments, the bulk conductive material 120 can be the same material as the seed material of the barrier/seed structure 118, such as copper or copper alloys, or the bulk material can be polycrystalline silicon with a tungsten liner or other suitable materials.

Figure 9:
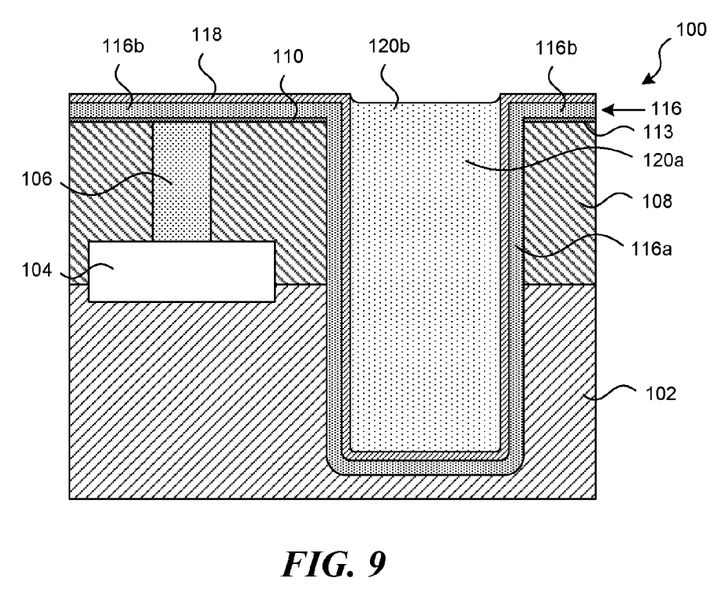
Figure 10:
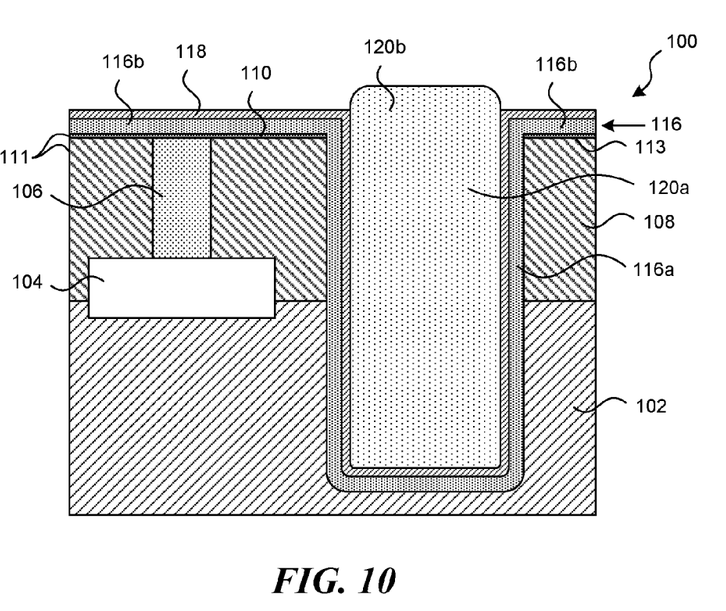

FIG. 9 shows the semiconductor device 100 after the excess portion 120b of the conductive material 120 has been removed. For example, the semiconductor device 100 can be processed using chemical-mechanical removal processes. In some embodiments, when the bulk conductive material 120 includes copper, the slurry can be configured to remove copper at high rates and/or selectivities compared to other materials. The removal step can entirely remove the excess portion 120b of the conductive material 120, as shown in FIG. 9, or leave some of the excess portion 120b for removal during subsequent processing. In some cases, high removal rates of the bulk conductive material 120 using the barrier/seed structure 118 as a stop material can cause an indentation in the top of the plug portion 120a in the opening 114. This indentation can be eliminated during further processing. For example, FIG. 10 shows an optional step in which the plug portion 120a can be annealed after the excess portion 120b of the conductive material 120 has been removed, which expands the plug portion 120a so that the plug portion 120a protrudes beyond the level of the barrier/seed structure 118. Annealing can also enhance the grain structure of the plug portion 120a and/or reduce or eliminate gaps or other irregularities at the interface between the plug portion 120a and the barrier/seed structure 118. This can enhance electron flow through the plug portion 120a during operation of the semiconductor device 100 and/or enhance the reliability of the semiconductor device 100. The barrier/seed structure 118 can also be removed completely or partially when the excess portion 120b of the conductive material 120 is removed.

Figure 11:
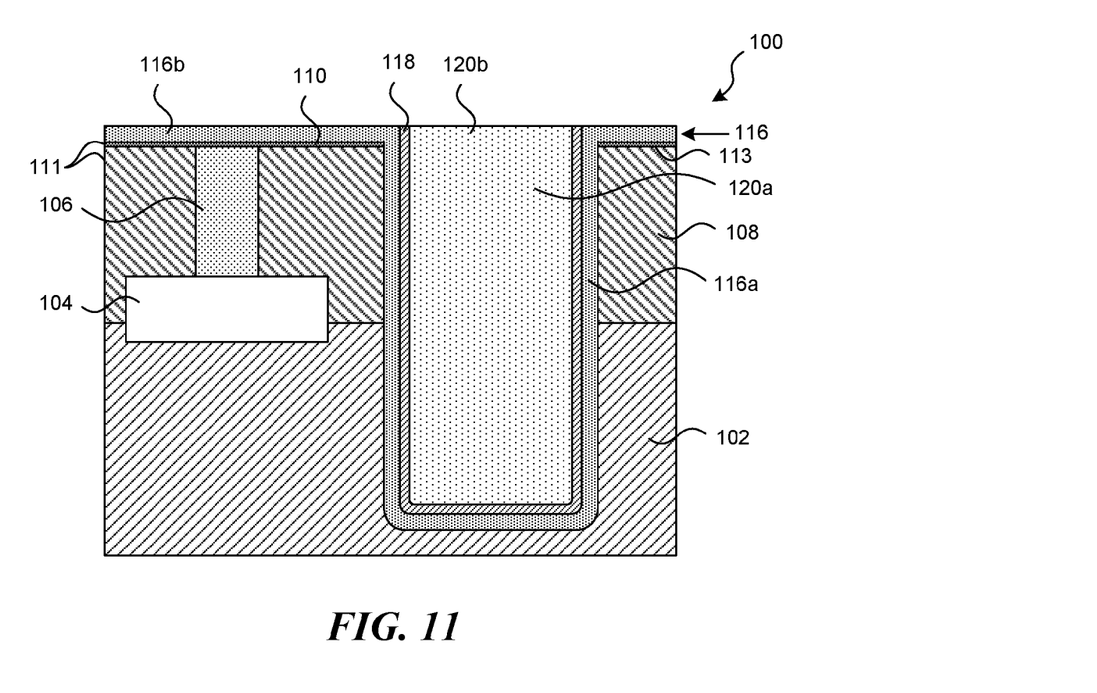

FIG. 11 shows an option in which the barrier/seed structure 118 over the second portion 116b of the dielectric liner material 116 and the protruding volume of the annealed plug portion 120a are removed. In several embodiments, these features can be removed using a chemical-mechanical removal process. The parameters of the chemical-mechanical removal process can be selected to remove the lateral portion of the barrier/seed structure 118 and the protruding volume of the plug portion 120a at a relatively high removal rate to enhance the efficiency of the overall manufacturing process. In some cases, part of the second portion 116b of the dielectric liner material 116 can also be removed, but one aspect of the present technology is that at least a sufficient amount of the second portion 116b of the dielectric liner material 116 remains intact and becomes a permanent feature that provides the dielectric material for forming conductive features above the contact 106 and the plug portion 120a. In several embodiments, the removal process of the lateral portion of the barrier/seed structure 118 and the protruding volume of the plug portion 120a exposes the second portion 116b of the dielectric liner material 116 such that the second portion 116b of the dielectric liner material 116 has a sufficient thickness for forming damascene-type conductive lines or other conductive lines on the contact 106 and/or the plug portion 120a.

Figure 12:
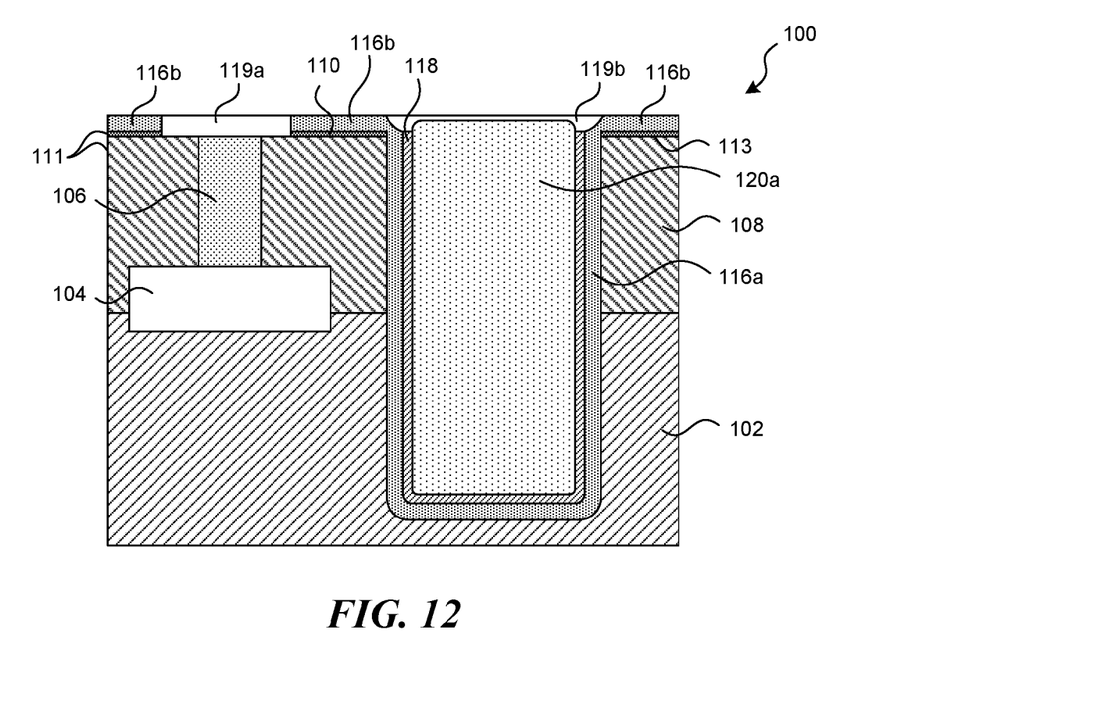

FIG. 12 illustrates the semiconductor device 100 after the second portion 116b of the dielectric liner material 116 has been patterned and etched to form first and second openings 119a and 119b, respectively. The openings 119a and 119b can be first and second trenches, respectively, such that the first opening 119a is aligned with the contact 106 and the second opening 119b is aligned with the plug portion 120a. The openings 119a and 119b can be formed in the second portion 116b of the dielectric liner material 116 using a suitable etch that removes the selected portions of the dielectric liner material 116 faster than the stop material 110 and the conductive material of the plug portion 120a. The remaining portion of the stop material 110 over the contact 106 can then be removed in a second etch. In other embodiments, however, a single etch can remove both the area of the second portion 116b of the dielectric liner material 116 and the stop material 110 over the contact 106.

Figure 13:
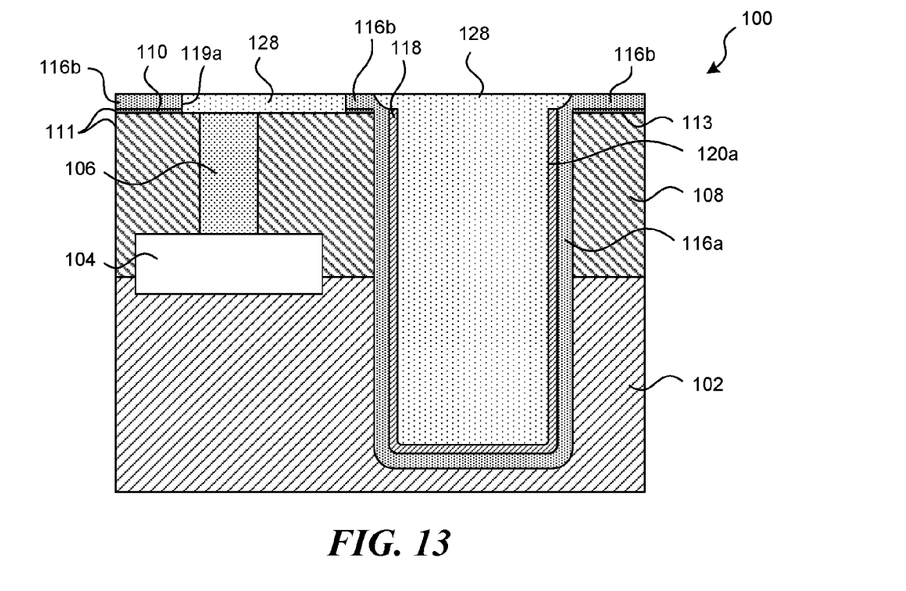

FIG. 13 illustrates a subsequent stage of an embodiment of a method in accordance with the technology after the first and second openings 119a and 119b have been filled with a conductive material 128 and then planarized to the level of the second portion 116b of the dielectric liner material 116. In several embodiments, the composition of the conductive lines 128 can be the same as the composition of the plug portion 120a. The conductive lines 128 can include, for example, copper or another suitably conductive material.

Figure 14:
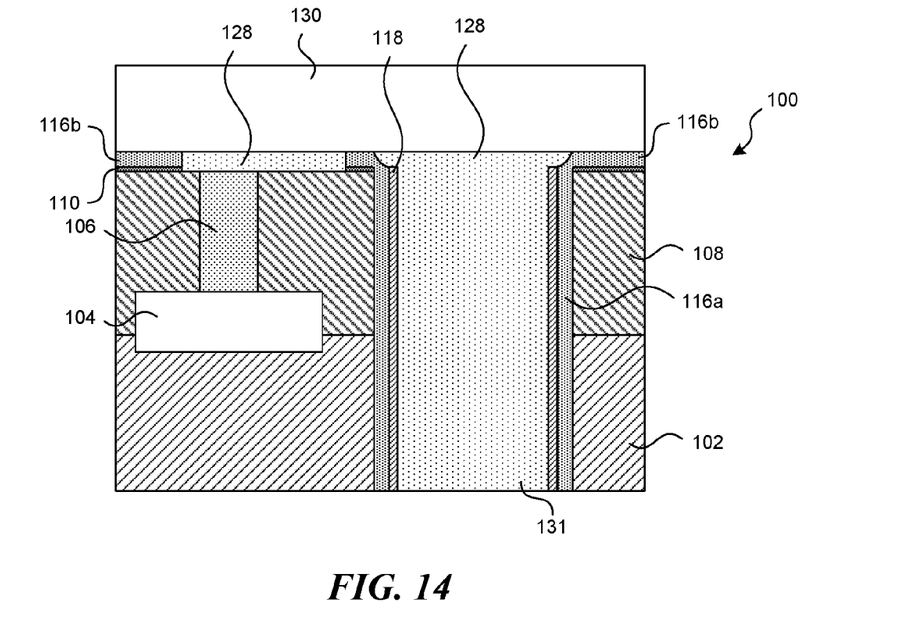
FIG. 14 is a partially schematic cross-sectional view illustrating a semiconductor device made by the methods shown in FIGS. 1-13.

FIG. 14 is a partial cross-sectional view schematically illustrating an embodiment of the final semiconductor device 100 after additional processing but before packaging. At this stage, additional dielectric and metallization structures 130

(shown schematically) can be formed over the conductive lines 128 to complete a suitable circuit of electrical connections within the semiconductor device 100. As shown in FIG. 14, a lower portion of the substrate 102 can also be removed by back grinding or other suitable removal processes to form a TSV 131 from the plug portion 120a. Notably, the final semiconductor device in FIG. 14 includes the remaining thickness of the second portion 116b of the dielectric liner material 116.

The semiconductor device 100 shown in FIG. 14 can then be incorporated alone or with other semiconductor devices into a suitable package (not shown). For example, the TSV 131 can be connected to leads (not shown) of the package using wire bonds (not shown), solder bumps (not shown), or other suitable electrical connectors. The semiconductor device 100 can also be stacked on similar devices in a stacked-die device. The semiconductor device 100, or a stack of semiconductor devices 100 and associated structures, can also be encapsulated for protection and to facilitate heat dissipation during operation.

Figure 15:
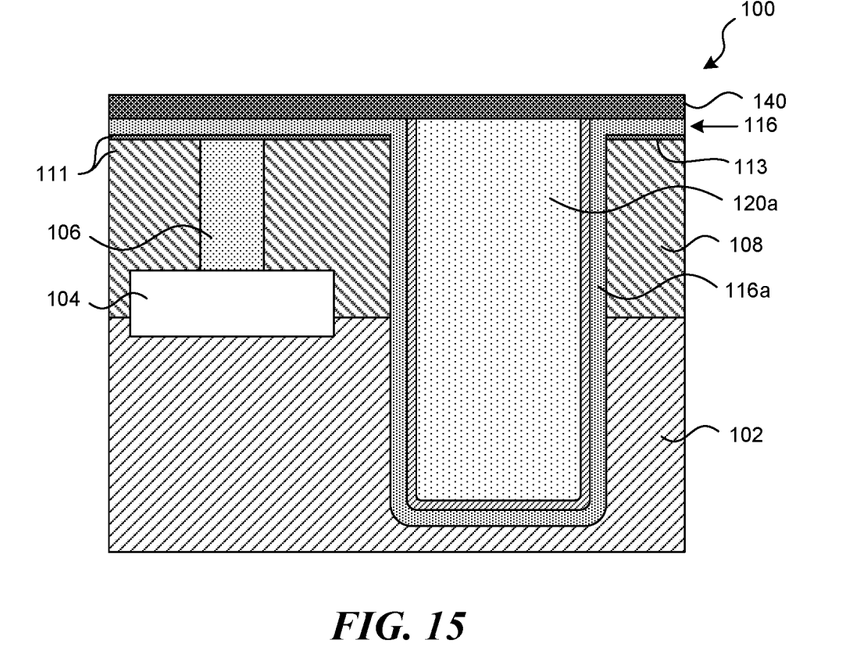
FIGS. 15-17 are partially schematic cross-sectional views illustrating a semiconductor device at selected steps in a method for making conductive structures in accordance with another embodiment of the present technology. More specifically, FIGS. 15-17 correspond to alternate embodiments of the stages shown in FIGS. 11-13.
Figure 16:
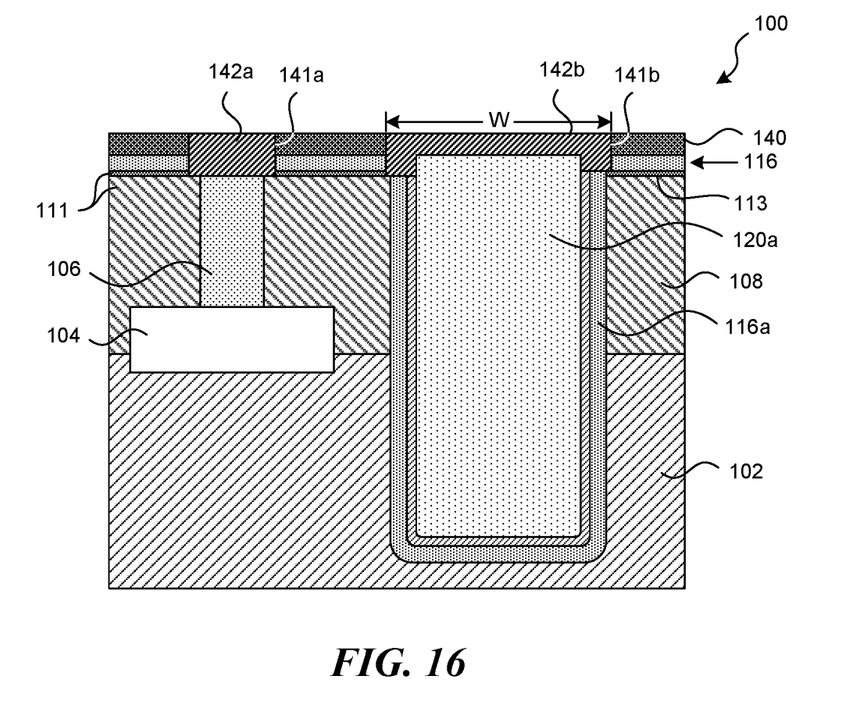
Figure 17:
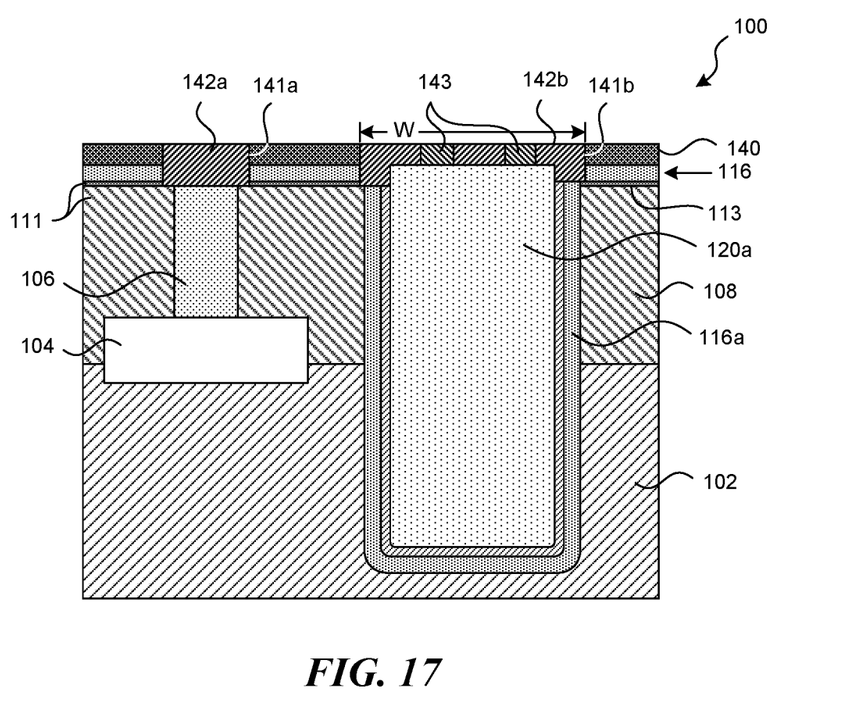

FIG. 15 shows another embodiment of the semiconductor device 100 after the structure in FIG. 11 has been formed, and an additional damascene dielectric material 140 has been formed over the dielectric liner material 116 and the plug portion 120a. The additional damascene material 140 can provide additional dielectric material for forming damascene structures that can be coupled to the contact 106 and/or the plug portion 120a. For example, FIGS. 16 and 17 show different damascene structures formed in the additional damascene dielectric material 140 and the second portion 116b of the dielectric liner material 116. FIG. 16, more specifically, shows a first damascene structure 142a formed in a first opening 141a extending through the damascene dielectric material 140 and the second portion 116b of the dielectric liner material 116 over the contact 106. The first damascene structure 142a can have a width wider than that of the contact 106. The semiconductor device 100 can include a second damascene structure 142b formed in a second opening 141b such that the second damascene structure 142b is electrically connected to the plug portion 120a. The second damascene structure 142b can have a width or other cross-sectional dimension larger than that of the plug portion 120a. For example, the width W of the second damascene structure 142b can be approximately 5-50% greater than that of the plug portion 120a. FIG. 17 illustrates another embodiment in which the second damascene structure 142b is segmented with dielectric features 143.

Figure 18:
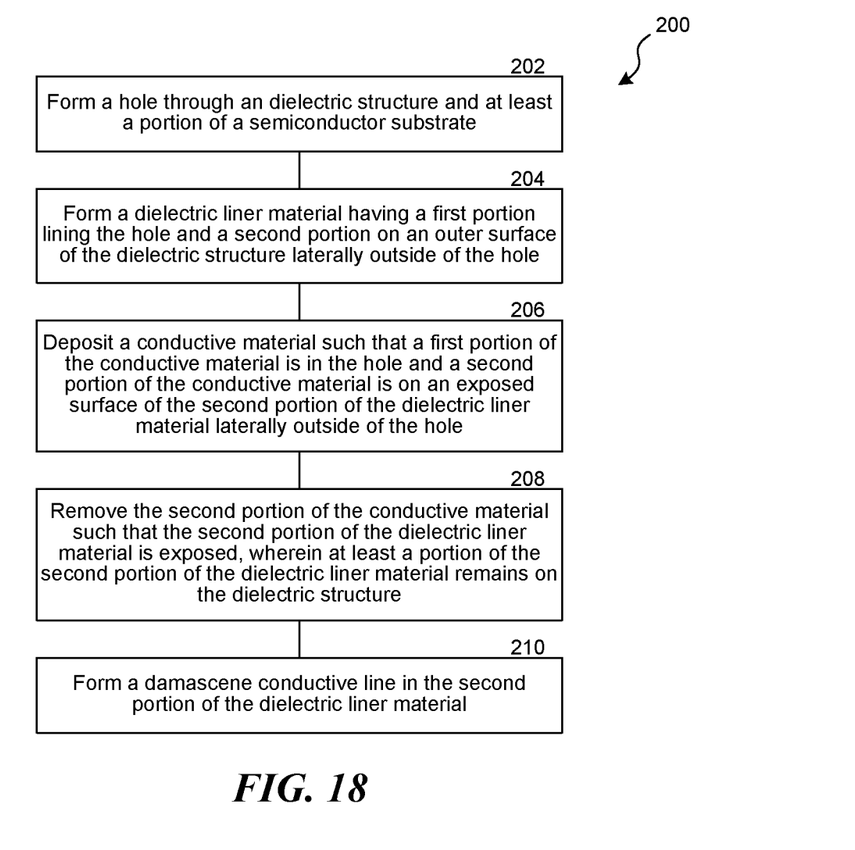
FIGS. 18 and 19 are flow charts of embodiments of methods in accordance with the present technology.

FIG. 18 is a flowchart of a method 200 in accordance with an embodiment of the technology. In this embodiment, the method 200 is directed to a method of manufacturing a semiconductor device including forming an opening through a dielectric structure in at least a portion of a semiconductor substrate (block 202). The opening, for example, can be formed as set forth above with respect to FIGS. 3-5. The method 200 further includes forming a dielectric liner material having a first portion lining the opening and a second portion on an outer surface of the dielectric structure laterally outside of the opening (block 204). The dielectric liner material, for example, can be formed as set forth above with respect to FIG. 6. The method 200 can further include depositing a conductive material such that a first portion of the conductive material is in the opening, and a second portion of the conductive material is on an exposed surface of a second portion of the dielectric liner material laterally outside of the opening (block 206). The conductive material can be deposited using a vapor deposition process, plating process, or other suitable process. For example, the conductive material can be formed as set forth above with respect to FIG. 7-8. The method 200 can further include removing the second portion of the conductive material such that the second portion of the liner material is exposed, wherein at least a portion of the second portion of the dielectric liner material remains on the dielectric structure (block 208). An embodiment of such removal of a second portion of the conductive material is explained above with respect to FIGS. 9-11. The method 200 can further include forming a damascene conductive line in the second portion of the dielectric liner material such that the conductive line is electrically coupled to the conductive material in the opening (block 210). For example, the damascene conductive line can be formed in a trench aligned with the conductive material in the opening. One example of this stage of the method 200 is described above with respect to FIGS. 12 and 13. In an alternative embodiment shown in FIGS. 15-17, an additional damascene dielectric material can be deposited on the second portion of the dielectric liner material, and the damascene conductive line can be formed in a trench through the additional damascene dielectric material and the second portion of the dielectric liner material.

Figure 19:
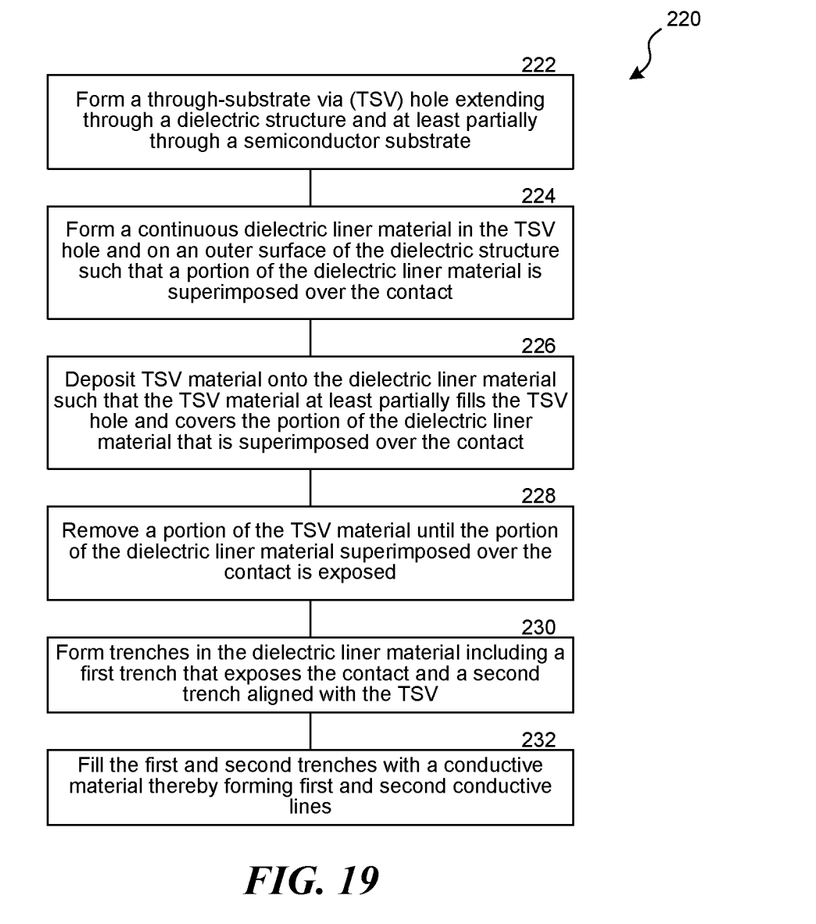
Figure 20:
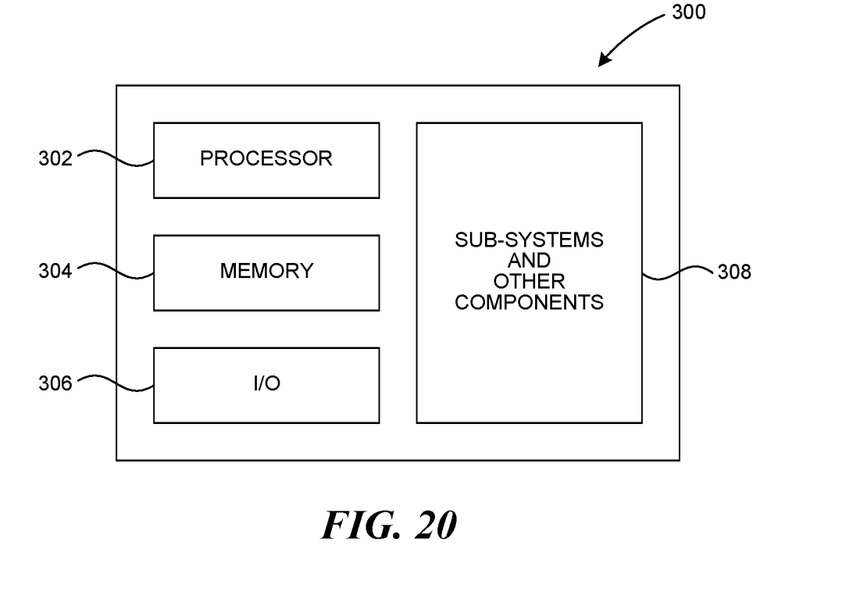
FIG. 20 is a block diagram illustrating a system that incorporates a semiconductor device in accordance with an embodiment of the present technology.

FIG. 19 illustrates another embodiment of a method 220 in accordance with the present technology. The method 220 can include forming a TSV opening extending through a dielectric structure and at least partially through a semiconductor substrate (block 222). The TSV opening is spaced laterally apart from a contact that is electrically coupled to a solid-state feature on and/or in the substrate. The method 220 can further include forming a continuous dielectric liner material in the TSV opening and on an outer surface of the dielectric structure such that a portion of the dielectric liner material is superimposed over the contact (block 224). Method 220 further includes depositing TSV material onto the dielectric liner material such that the TSV material at least partially fills the TSV opening and covers the portion of the dielectric liner material that is superimposed over the contact (block 226). After depositing the TSV material, the method 220 continues by removing a portion of the TSV material until the portion of the dielectric liner material superimposed over the contact is exposed (block 228). The remaining portion of the TSV material resides in the TSV opening and defines a TSV. The method 220 further includes forming trenches in the dielectric liner material such that a first trench exposes the contact and a second trench is aligned with the TSV (block 230). The first and second trenches are then filled with a conductive material to thereby form first and second conductive lines (block 232).

Any one of the semiconductor devices having the features described above with reference to FIGS. 1-16 can be incorporated into any of a myriad of larger and/or more complex systems, a representative example of which is system 300 shown schematically in FIG. 17. The system 300 can include a processor 302, a memory 304 (e.g., SRAM, DRAM, flash, and/or other memory devices), input/output devices 306, and/or other subsystems or components 308. The semiconductor device 100 described above with reference to FIGS. 1-16 can be included in any of the elements shown in FIG. 17. The resulting system 300 can be configured to perform any of a wide variety of suitable computing, processing, storage, sensing, imaging, and/or other functions. Accordingly, representative examples of the system 300 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 300 include lights, cameras, vehicles, etc. With regard to these and other example, the system 300 can be housed in a single unit or distributed over multiple interconnected units, e.g., through a communication network. The components of the system 300 can accordingly include local and/or remote memory storage devices and any of a wide variety of suitable computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

We claim:

1. A semiconductor device, comprising:
   a semiconductor substrate having solid-state feature;
   a dielectric structure on the semiconductor substrate;
   a conductive contact extending through the dielectric structure and electrically coupled to the solid-state feature;
   a through-substrate via (TSV) opening extending through the dielectric structure and at least partially through the semiconductor substrate, wherein the contact is spaced laterally apart from the TSV opening;
   a dielectric liner material having a first portion lining the TSV opening and a second portion on an outer surface of the dielectric structure laterally outside of the TSV opening;
   a conductive material in the TSV opening defining a TSV spaced laterally apart from the contact; and
   a plurality of damascene conductive lines in the dielectric liner material including at least a first damascene conductive line aligned with the TSV and a second damascene conductive line aligned with the contact, wherein the first and second damascene conductive lines extend through the dielectric liner material over the dielectric structure laterally with respect to the TSV and the contact, and
   wherein the first and second portions of the dielectric liner material are permanent components of the final device.

2. The semiconductor device of claim 1 wherein the dielectric liner material comprises an undoped oxide.

3. The semiconductor device of claim 1 wherein:
   the dielectric liner material comprises an undoped oxide;
   the conductive material in the TSV opening comprises copper; and
   the second portion of the dielectric liner material has a thickness at least approximately equal to the conductive lines in the dielectric liner material.

4. The semiconductor device of claim 1 wherein the first and second portions of the dielectric liner material are continuous.

5. The semiconductor device of claim 4 wherein the first and second portions of the dielectric liner material are integral with each other.

6. The semiconductor device of claim 1 wherein the conductive lines in the dielectric liner material comprise copper damascene lines.

7. A semiconductor device, comprising:
   a semiconductor substrate having solid-state feature;
   a dielectric structure on the semiconductor substrate;
   a conductive contact through the dielectric structure and electrically coupled to the solid-state feature;
   a through-substrate via (TSV) opening having sidewalls extending through the dielectric structure and at least partially through the semiconductor substrate, wherein the contact is spaced laterally apart from the TSV opening;
   a continuous liner dielectric material extending over a surface of the dielectric structure laterally outside of the TSV opening and along the sidewalls of the TSV openings, wherein the continuous liner dielectric material has at least one opening laterally separated from the TSV opening and aligned with the conductive contact;
   a conductive material in the TSV opening that defines a TSV; and
   a conductive material in the opening through the continuous liner that defines a damascene conductive line electrically coupled to the conductive contact, wherein the damascene conductive line extends through the continuous liner over the dielectric structure laterally with respect to the conductive contact.

8. The semiconductor device of claim 7 wherein the dielectric liner material has a first portion lining the TSV opening and a second portion covering the dielectric structure.

9. The semiconductor device of claim 8 wherein the first and second portions of the dielectric liner material comprise a conformal layer of an undoped oxide.

10. The semiconductor device of claim 7 wherein:
the dielectric liner material comprises an undoped oxide;
the conductive material in the TSV opening comprises copper; and
the dielectric liner material extending over the surface of the dielectric structure has a thickness at least approximately equal to the conductive lines in the dielectric liner material.

\* \* \* \* \*